(12) United States Patent  
Chung et al.

(10) Patent No.: US 7,249,300 B2  
(45) Date of Patent: Jul. 24, 2007

(54) INTEGRATED CIRCUIT DEVICE INCLUDING A SCAN TEST CIRCUIT AND METHODS OF TESTING THE SAME

(75) Inventors: Seung-jae Chung, Kyungki-do (KR); Yong-chun Kim, Kyungki-do (KR)

(73) Assignee: Samsung Electronics Co. Ltd. (KR)

( * ) Notice: Subject to any disclaimer, the term of this patent is extended or adjusted under 35 U.S.C. 154(b) by 421 days.

(21) Appl. No.: 10/696,090

(22) Filed: Oct. 29, 2003

(65) Prior Publication Data

US 2004/0128598 A1    Jul. 1, 2004

(30) Foreign Application Priority Data

Dec. 30, 2002    (KR) .................... 10-2002-0087246

(51) Int. Cl.
*G01R 31/28*    (2006.01)
(52) U.S. Cl. ..................................... 714/726
(58) Field of Classification Search ......... 714/726.727, 714/729

See application file for complete search history.

(56) References Cited

U.S. PATENT DOCUMENTS

| | | | |
|---|---|---|---|
| 5,774,476 A * | 6/1998 | Pressly et al. | 714/726 |
| 6,816,990 B2 * | 11/2004 | Song et al. | 714/729 |
| 6,877,122 B2 * | 4/2005 | Whetsel | 714/727 |
| 6,988,228 B2 * | 1/2006 | Paglieri | 714/726 |

* cited by examiner

*Primary Examiner*—James C Kerveros
(74) *Attorney, Agent, or Firm*—Myers Bigel Sibley & Sajovec

(57) ABSTRACT

Integrated circuit devices include a core block having a plurality of output ports and a plurality of input ports and a vector input terminal. The core block generates core internal data responsive to output data from the input ports and is configured to output the core internal data during scan testing and to selectively generate core output data for the output ports responsive to the core internal data or to test vector serial input data from the vector input terminal. An input side sub logic circuit unit generates sub data for the plurality of input ports responsive to data input to the first sub logic circuit unit. A multiplexer (MUX) unit between the core block and the first sub logic circuit unit selectively provides the sub data or the output data as inputs to the input ports of the core block responsive to a MUX control signal.

24 Claims, 4 Drawing Sheets

INTEGRATED CIRCUIT DEVICE
INCLUDING A SCAN TEST CIRCUIT AND
METHODS OF TESTING THE SAME

RELATED APPLICATION

This application claims priority to Korean Patent Application 2002-87246, filed on Dec. 30, 2002, the contents of which are herein incorporated by reference in their entirety.

BACKGROUND OF THE INVENTION

The present invention relates to integrated circuit devices and more particularly to integrated circuit devices including test circuits and methods for testing the same.

Integrated circuit (semiconductor) memory devices, such as dynamic random access memories (DRAMs) and/or application specific integrated circuit (ASIC) are generally tested before being shipped to customers. Such devices are generated first through a design process followed by manufacturing based on the design and then testing of the device during manufacture and/or after the manufacturing process is completed. Such testing operations prior to shipment may include integrated circuit chip testing and/or package testing. The testing process may include a test of macro block(s) of the device in various test modes. A macro block may be a programmable intellectual property (IP) core. Examples of such IP cores include a micro controller unit (MCU), a digital signal processor (DSP) and/or other cores used for a particular function.

Methods of testing a programmable IP core can be classified as one of two types. One type of such testing is a conventional dynamic simulation test method in which fault coverage is heightened by operating a functional vector using fault simulation software, such as Verifault™ available from Cadence Software Inc. A second type of such testing is a serial test method, such as a full scan test method, that uses a scan test circuit included in the integrated circuit device.

One advantage of the conventional dynamic simulation test method is that, as a scan test circuit is not required on the device, a smaller sized chip may be used for the device. However, the fault coverage of the dynamic simulation test method is generally lower than the serial test method. In addition, if the programmable IP core is tested using the conventional dynamic simulation test method, a common test vector usable for any integrated circuit device including the programmable IP core is needed rather than a test vector for only a particular integrated circuit device. As different integrated circuit devices typically have different methods for generating an input/output (IO) address, memory maps, pads, and/or peripheral interfaces, defining a common test vector may be difficult and may be limited in the conditions tested using the common test vector on a particular integrated circuit device. Therefore, programmable IP cores are generally configured to include a scan test circuit for performing the full scan test method.

If the integrated circuit device including the programmable IP core is designed to support the full scan test method of the device, it may be tested using the scan test circuit included in the programmable IP core. If the integrated circuit device including the programmable IP core is not designed to support the full scan test of the device, the device may still be tested using the conventional dynamic simulation test method without needing to use the scan test circuit of the IP core.

If an integrated circuit device including the programmable IP core is not designed to be generally adaptable for full scan testing as a whole, but only the programmable IP core or elements except for the programmable IP core are designed to be adaptable for full scan testing, all input and output signals of the programmable IP core typically have to be output to an external pin of the integrated circuit device. However, such a signal routing may be difficult as the number of input and output signals of the programmable IP core may be greater than the number of external pins of the device. In such a design, a chain-shaped scan test circuit may be added to input and output terminals of the programmable IP core. Test vectors are loaded to the chain-shaped scan test circuit in series or output signals to the output terminal are captured in the chain-shaped scan test circuit in series.

FIG. 1 is a block diagram of a conventional integrated circuit device. As shown in FIG. 1, an integrated circuit device having a conventional scan test circuit generally includes a first sub logic circuit unit 110, a core block 130, and a second sub logic circuit unit 150. The first sub logic circuit unit 110 receives and processes input data MDI and the core block 130 receives and processes data SL1 through SLN output from the first sub logic circuit unit 110. The second sub logic circuit unit 150 receives and processes data CD1 through CDN output from the core block 130 and outputs output data MDO.

FIG. 2 shows an example of each port included in a peripheral scan test circuit (not shown in FIG. 1) around the core block 130 when the first and second sub logic circuit units 110 and 150 of FIG. 1 are designed to be adaptable for a scan test method. As shown in FIG. 2, if the first and second logic circuit units 110 and 150, but not the core block 130, are designed to be adaptable for the full scan test method, two multiplexers (MUX) 213 and 217 and one flip-flop 215 are generally required for each port of the scan test circuit near output and input terminals of the core block 130. The two multiplexers 213, 217 and flip-flop 215 may operate to determine observability for normal operations of the core block 130 and the first and second sub logic circuit units 110 and 150 by using serial output data TDO. They may also operate to determine controllability for the core block 130 by using data SD input to the core block 130 or the second sub logic circuit unit 150 responsive to serial input data TDI. The flip-flop 215 operates in synchronization with a system clock signal SCLK.

For the circuit of FIG. 2, if the number of input and output ports of the core block 130 is 100 each, 400 MUXes and 200 flip-flops are required. The MUX control signal TM is activated or deactivated depending on whether a scan test is being performed. The MUX control signal TM is also activated or deactivated depending on whether serial input data TDI used as a serial test vector is being input to the scan test circuit or whether an output of the first sub logic circuit unit 110 or the core block 130 is being input to scan test circuit.

FIG. 3 shows an example of each port included in the scan test circuit, near the input terminal of the core block 130, when only the core block 130 is designed to be adaptable for the scan test method. A shown in FIG. 3, if only the core block 130 is designed to be adaptable for full scan testing, it is generally only required for the scan test circuit to determine controllability for the core block 130 by using data S1D output to the core block 130 responsive to the serial input data TDI. Thus, one MUX 315 and one flip-flop 313 are typically required for each port included in the scan test circuit, near the input terminal of the core block 130. The flip-flop 313 operates in synchronization with the system clock signal SCLK. Thus, if the number of input and output ports is 100 each, 100 MUXes and 100 flip-flops are needed when using the circuit of FIG. 3.

FIG. 4 shows another example of each port included in the scan test circuit, near the output terminal of the core block 130, when only the core block 130 is designed to be adaptable for the scan test method. FIG. 4 is similar to FIG. 3. However, for the circuit of FIG. 4, the scan test circuit is required to determine only observability for a normal operation of the core block 130 by using serial output data TDO. Therefore, one MUX 413 and one flip-flop 415 are typically required for each port in the scan test circuit in the output terminal of the core block 130. The flip-flop 415 operates in synchronization with the system clock signal SCLK and the output data S2D for each port is input to the second sub logic circuit unit 150. If the number of input ports is 100 and is the same as the number of output ports, 100 MUXes and 100 flip-flops are needed using the circuit of FIG. 4.

As discussed above, if the integrated circuit device as a whole is not designed to be adaptable for the full scan test method, the device may be tested using only the conventional dynamic simulation test method. If only the programmable IP core is designed to be adaptable for the scan test method, or only other elements and not the core block are designed to be adaptable for the scan test method, a scan test circuit may be provided for each input port or output port around the programmable IP core.

As also described above, it may be difficult to create a common test vector that can be used by any device including the programmable IP core, rather than a vector designed for a particular integrated circuit device including the programmable IP core, to compensate for a low fault coverage. In addition, as a scan test circuit may need to be provided for each input port and/or output port around the programmable IP core, the integrated circuit device, in addition to common features like a data bus, an address bus, and the like, may have to include hundreds of MUXes and flip-flops of the scan test circuits. As a result, the size of the integrated circuit device may be undesirably increased.

SUMMARY OF THE INVENTION

In some embodiments of the present invention, integrated circuit devices include a core block configured for dynamic simulation testing and having an associated plurality of output ports. The core block generates core output data for the plurality of ports responsive to output data for the plurality of output ports input to a plurality of input ports of the core block. An input side sub logic circuit unit is configured for dynamic simulation testing and is coupled to the input ports of the core block. The input side sub logic circuit unit generates sub data for the plurality of input ports responsive to data input to the first sub logic circuit unit. A multiplexer (MUX) unit between the core block and the first sub logic circuit unit selectively provides the sub data or the output data as inputs to the input ports of the core block responsive to a MUX control signal.

In other embodiments of the present invention, the integrated circuit device further includes an output side sub logic circuit unit configured for dynamic simulation testing that is coupled to the plurality of output ports of the core block. The output side sub logic circuit unit outputs final output data responsive to the core output data from the core block. The MUX unit may include a plurality of multiplexers, ones of which are associated with respective ones of the input ports of the core block.

In further embodiments of the present invention, integrated circuit devices include a core block having a plurality of output ports and a plurality of input ports and a vector input terminal. The core block generates core internal data responsive to output data from the input ports. The core block is configured to output the core internal data during scan testing and to selectively generate core output data for the output ports responsive to the core internal data or to test vector serial input data from the vector input terminal. An input side sub logic circuit unit is configured for dynamic simulation testing and is coupled to the input ports of the core block. The input side sub logic circuit unit generates sub data for the plurality of input ports responsive to data input to the first sub logic circuit unit. A multiplexer (MUX) unit between the core block and the first sub logic circuit unit selectively provides the sub data or the output data as inputs to the input ports of the core block responsive to a MUX control signal.

In other embodiments of the present invention, the integrated circuit device further includes an output side sub logic circuit unit configured for dynamic simulation testing that is coupled to the plurality of output ports of the core block. The output side sub logic circuit unit outputs final output data responsive to the core output data from the core block. The core block may include a first core logic circuit unit that generates the core internal data and a scan test circuit unit coupled to the first core logic circuit unit and the vector input terminal that is configured to output the core internal data during scan testing and to selectively output data associated with ones of the output ports responsive to the core internal data or to the test vector serial input data. The core block may further include a second core logic circuit unit coupled to the scan test circuit that generates the core output data responsive to the output data associated with ones of the output ports received from the scan test circuit unit. The core block may have a vector output terminal and the scan test circuit unit may be configured to serially output the core internal data to the vector output terminal during scan testing.

In further embodiments of the present invention, the scan test circuit unit includes a plurality of multiplexers and at least one flip-flop for each output port. The scan test circuit unit may consist of two multiplexers and one flip-flop for each output port.

In other embodiments of the present invention, the scan test circuit unit includes at least one multiplexer and at least one flip-flop for each output port. The scan test circuit unit may consist of one multiplexer and one flip-flop for each output port.

In further embodiments of the present invention, methods for testing an integrated circuit device in which a plurality of associated macro blocks to be tested are configured for dynamic simulation testing include generating at a first sub logic circuit unit of the macro blocks sub data for input to a plurality of input ports of a core block of the macro blocks responsive to data input to the first sub logic circuit unit core from external to the macro blocks. The sub data and/or output data for a plurality of output ports of the core block is provided to a multiplexer (MUX) unit coupled between the core block and the first sub logic circuit that selectively provides the sub data or the output data as inputs to the input ports of the core block responsive to a MUX control signal. Core output data for the output ports is generated at the core responsive to the MUX input to the input ports of the core block.

In other embodiments of the present invention, methods for testing an integrated circuit device in which a core block of a plurality of associated macro blocks to be tested has a vector input terminal and is configured for scan testing and others of the associated macro blocks are configured for dynamic simulation testing include generating at a first sub logic circuit unit of the others of the associated macro blocks sub data for input to a plurality of input ports of the core block responsive to data input to the first sub logic circuit unit core from external to the macro blocks. The sub data and/or output data for a plurality of output ports of the core block is provided to a multiplexer (MUX) unit coupled between the core block and the first sub logic circuit that selectively provides the sub data or the output data as inputs to the input ports of the core block responsive to a MUX control signal. Core internal data is generated at the core block responsive to the inputs to the input ports of the core block. The core internal data is output from the core block during scan testing. Core output data for the output ports is selectively generated at the core block responsive to the core internal data or to test vector serial input data from the vector input terminal.

In some embodiments, present invention provides a semiconductor device having a scan test circuit that may allow chip downsizing when the scan test circuits, whose number is the same as the number of input ports or output ports, have to be included around a programmable intellectual property (IP) core. In some embodiments, the present invention may also provide a scan test method of a semiconductor device that may allow chip downsizing when the scan test circuits, whose number is the same as the number of input ports or output ports, has to be included around a programmable intellectual property (IP) core.

According to some embodiments of the present invention, there is provided a semiconductor device including a first sub logic circuit unit, a MUX unit, a core block, and a second sub logic circuit unit. The first sub logic circuit unit is designed to be adaptable for a dynamic simulation test method and generates sub data for each port by processing data received from the outside. The MUX unit is controlled by a MUX control signal and selectively outputs the sub data for each port or core output data for each port. The core block is designed to be adaptable for the dynamic simulation test method and generates the core output data for each port by processing the output data for each port received from the MUX unit. The second sub logic circuit unit is designed to be adaptable for the dynamic simulation test method and outputs final output data to the outside by processing the core output data for each port received from the core block.

According to other embodiments of the present invention, there is provided a semiconductor device including a first sub logic circuit unit, a MUX unit, a core block, and a second sub logic circuit unit. The first sub logic circuit unit is designed to be adaptable for a dynamic simulation test method and generates sub data for each port by processing data received from the outside. The MUX unit is controlled by a MUX control signal and selectively outputs the sub data for each port or core output data for each port. The core block generates core internal data by processing the output data for each port received from the MUX unit and outputs the core internal data for each port to the outside by using a scan test method or generates the core output data for each port by selectively processing the core internal data for each port or serial input data for each port used as a test vector. The second sub logic circuit unit is designed to be adaptable for the dynamic simulation test method and outputs final output data to the outside by processing the core output data for each port received from the core block.

The core block may include a first core logic circuit unit, a scan test circuit unit, and a second core logic circuit. The first core logic circuit unit generates the core internal data for each port by processing the output data for each port received from the MUX unit. The scan test circuit unit outputs the core internal data for each port to the outside by using the scan test method or selectively outputs the core internal data for each port or the serial input data for each port used as the test vector. The second core logic circuit unit generates the core output data for each port by processing the output data for each port received from the scan test circuit unit.

The scan test circuit unit in some embodiments of the present invention includes two MUXes and one flip-flop for each port. The scan test circuit unit may include one MUX and one flip-flop for each port.

According to other embodiments of the present invention, there is provided a test method of a semiconductor device in which all macro blocks are designed to be adaptable for a dynamic simulation test method. The test method includes generating sub data for each port by processing data received from the outside, at a first sub block included in the macro blocks; selectively outputting the sub data for each port or core output data for each port, at a MUX included in the macro blocks and controlled by a MUX control signal; generating the core output data for each port by processing the output data for each port received from the MUX, at a core block included in the macro blocks; and outputting final output data to the outside by processing the core output data for each port received from the core block, at a second sub block included in the macro blocks.

According to yet further embodiments of the present invention, there is provided a test method of a semiconductor device in which a core block of macro blocks is designed to be adaptable for a scan test method and other blocks of the macro blocks are designed to be adaptable for a dynamic simulation test method. The test method includes generating sub data for each port by processing data received from outside, at a first sub block included in the other blocks of the macro blocks; selectively outputting the sub data for each port or core output data for each port, at a MUX included in the other blocks of the macro blocks and controlled by a MUX control signal; generating core internal data for each port by processing the output data for each port received from the MUX or generating the core output data for each port by selectively processing the core internal data for each port or serial input data used as a test vector received from outside, at the core block included in the macro blocks; and outputting final output data to the outside by processing the core output data for each port received from the core block, at a second sub block included in the other blocks of the macro blocks.

The core internal data for each port can be output to the outside by a scan test circuit using the scan test method. The scan test circuit may include two MUXes and one flip-flop for each port. The scan test circuit may also include one MUX and one flip-flop for each port.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "on" or "connected to" or "coupled to" another element, it can be directly on, connected to or coupled to the other element or intervening layers or elements may also be present. In contrast, when an element is referred to as being "directly on" or "directly connected to" or "directly coupled to" another element, there are no intervening layers or elements present.

Figure 5:
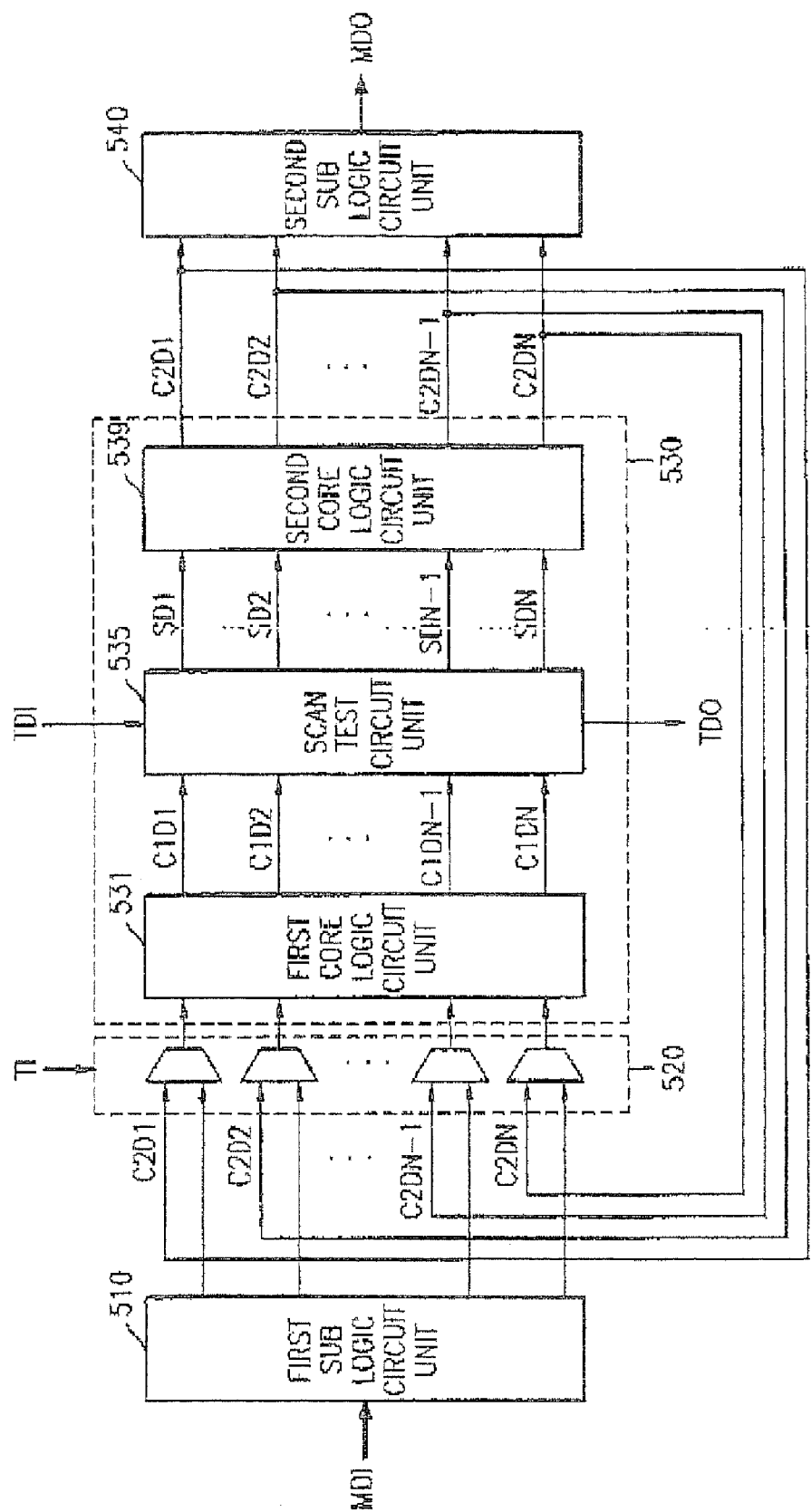
FIG. 5 is a block diagram of an integrated circuit (semiconductor) device including a scan test circuit according to some embodiments of the present invention.

The present invention will now be further described with reference to the embodiments illustrated in the figures. FIG. 5 is a block diagram of an integrated circuit (semiconductor) device including a scan test circuit according to some embodiments of the present invention. As shown in FIG. 5, the integrated circuit device includes a first sub logic circuit unit 510, a MUX unit 520, a core block 530, and a second sub logic circuit unit 540. In the integrated circuit device, the core block 530, which is included among macro blocks of the device, is designed to be adaptable for a scan test method. Furthermore, the first and second sub logic units 510 and 540, but not the core block 530, are designed to be adaptable for a dynamic simulation test method.

As described above, an integrated circuit device that is designed to be adaptable for a dynamic simulation test method performs a test by applying a functional vector that is created to be used in any integrated circuit device including a programmable intellectual property (IP) core. In addition, an integrated circuit device that is designed to be adaptable for the scan test method includes a scan test circuit in the device to process serial input data used as a test vector for each port, thereby improving fault coverage.

The first sub logic circuit unit 510 is designed to be adaptable for the dynamic simulation test method. The first sub logic circuit unit 510 generates output sub data for each output port by processing input data MDI. The multiplexer (MUX) unit 520 is controlled by a MUX control signal T1 and selectively outputs either the sub data from the first sub logic circuit unit 510 for each port or the core output data C2D1 through C2DN for each port.

The core block 530 generates core internal data C1D1 through C1DN for each port by processing the core output data C2D1 through 2DN for each port received from the MUX unit 520. As will be described further below, the core block 530 is configured to output the core internal data C1D1 through C1DN for each port to the outside using the scan test method or to selectively generate the core output data C2D1 through C2DN for each port by processing the core internal data C1D1 through C1DN for each port and/or by processing serial input data TDI used as a serial test vector for each port.

The second sub logic circuit unit 540 is designed to be adaptable for the dynamic simulation test method. The second sub logic circuit unit 540 is configured to output final output data MDO to the outside by processing the core output data C2D1 through C2DN for each port received from the core block 530.

As shown in FIG. 5, the core block 530 includes a first core logic circuit unit 531, a scan test circuit unit 535, and a second core logic circuit unit 539. The first core logic circuit unit 531 generates the core internal data C1D1 through C1DN for each port by processing the core output data C2D1 through C2DN for each port received from the MUX unit 520.

The scan test circuit unit 535 is configured to output the core internal data C1D1 through C1DN to the outside serially using the scan test method or to selectively output the core internal data C1D1 through C1DN for each port or the serial input data TDI used as the test vector for each port. The second core logic circuit unit 539 generates the core output data C2D1 through C2DN for each port by processing the output data SD1 through SDN for each port received from the scan test circuit unit 535.

Figure 1:
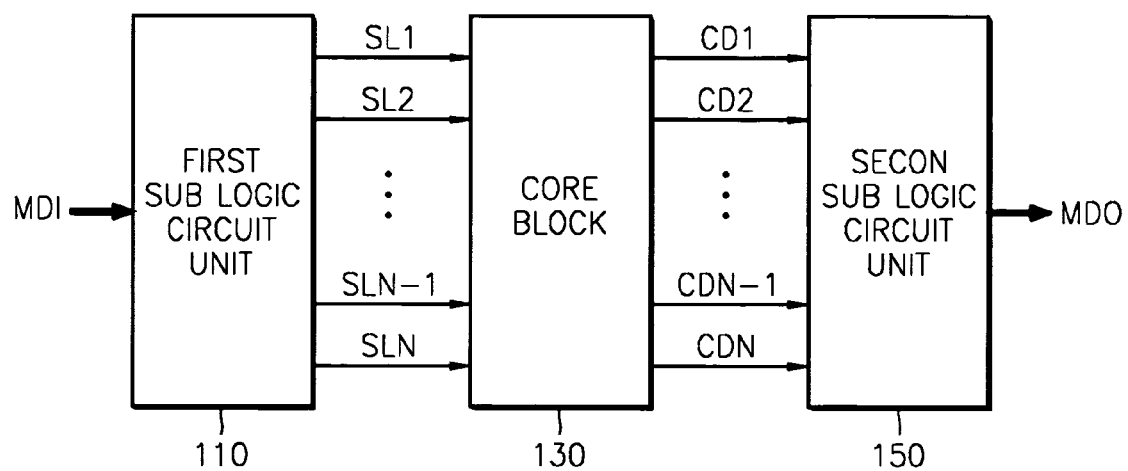
FIG. 1 is a block diagram of a conventional integrated device including a core block.
Figure 2:
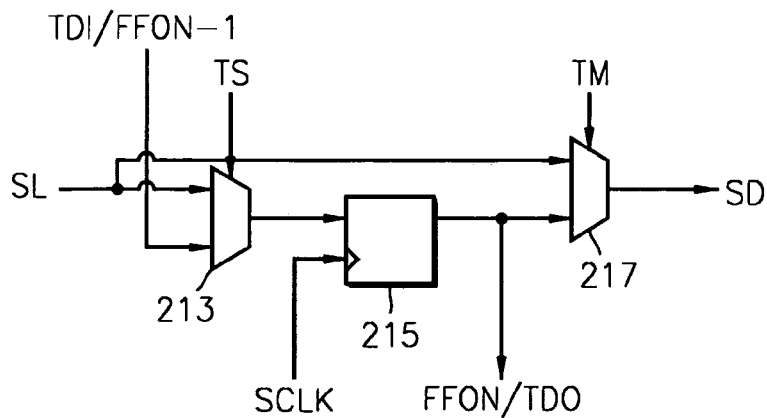
FIG. 2 is a circuit diagram for a scan test circuit associated with a port around the core block of FIG. 1, where a peripheral scan test circuit includes the circuit for each port and where first and second sub logic circuit units, but not the core block, are designed to be adaptable for a scan test method.
Figure 6:
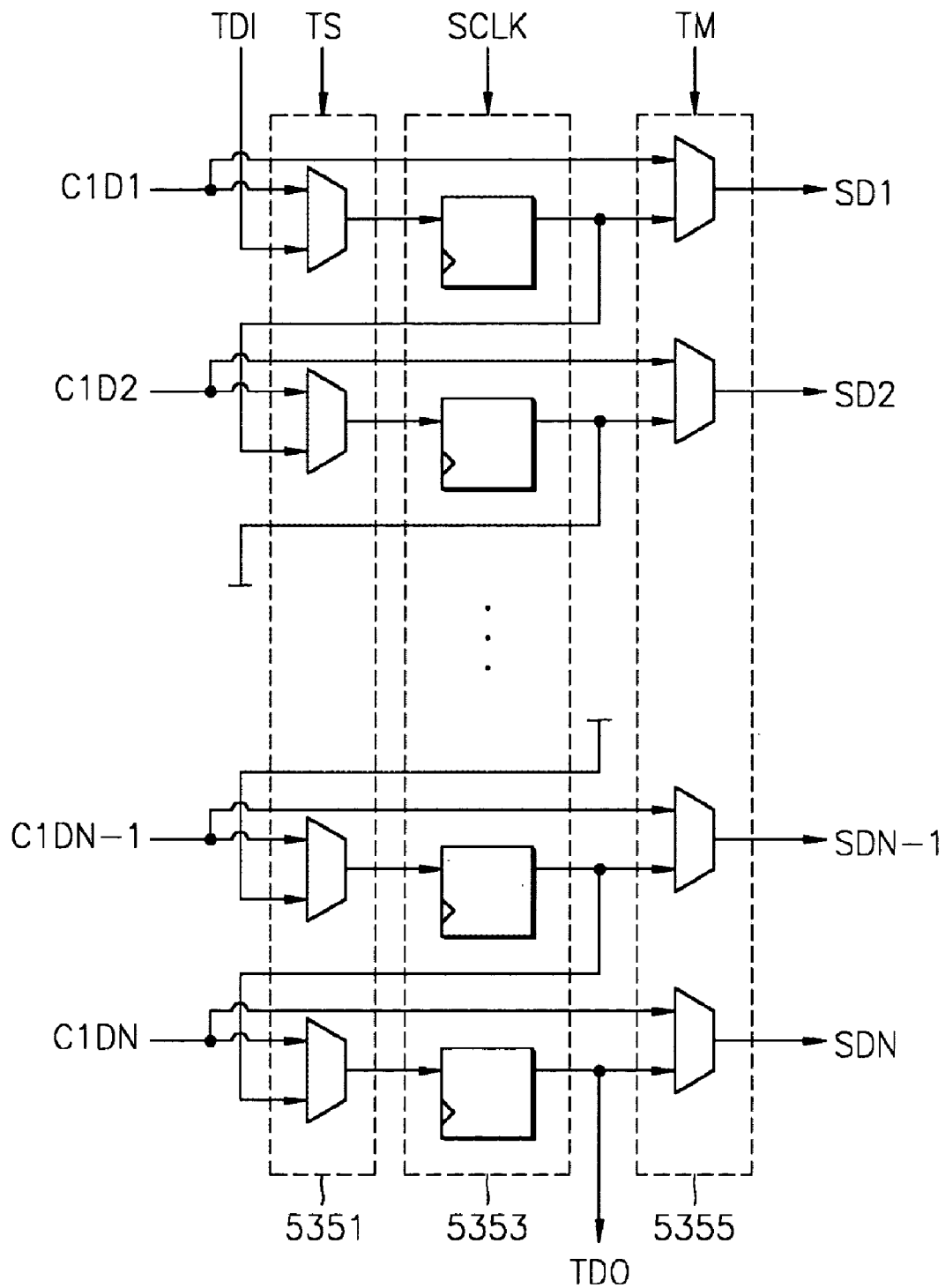
FIG. 6 is a circuit diagram of the scan test circuit unit of FIG. 5.

FIG. 6 is a circuit diagram of some embodiments of the scan test circuit unit 535 of FIG. 5. For the embodiments illustrated in FIG. 6, the scan test circuit unit 535 includes a first MUX unit 5351, a flip-flop unit 5353 and a second MUX unit 5355. Flip-flops included in the flip-flop unit 5353 operate in synchronization with a system clock SCLK. Thus, similarly to operations as described with reference to FIG. 2, in order to determine observability for normal operations of the first and second sub logic units 510 and 540 or controllability for the core block 530 by using data input to the core block 530, the scan test circuit unit 535 uses two MUXes and one flip-flop for each port.

As shown in FIG. 6, an output of each port of the flip-flop unit 5353 is provided as a first input of a second port of the first MUX unit 5351 to allow for serial scanning of the circuit. The serial input data TDI used as the test vector is a second input of a first port of the first MUX unit 5351. The output data SD1 through SDN output from each port of the second MUX unit 5355 is input to the first core logic circuit unit 531 the second core logic circuit unit 539 and/or the second sub logic circuit unit 540 and is used to determine controllability of the first core logic circuit unit 531, the second core logic circuit unit 539 and/or the second sub logic circuit unit 540. The serial output data TDO output from the last port of the flip-flop unit 5353 may be serially scanned to determine observability for normal operations of the first sub logic circuit unit 510, the first core logic circuit unit 531 and/or the second core logic circuit unit 539.

A control signal TM of the second MUX unit 5355 is activated or deactivated based on whether or not a scan test is performed. Thus, the second MUX 5355 selectively outputs the output data for each port output from the flip-flop unit 5353 or the core internal data C1D1 through C1DN as the output data SD1 through SDN. A control signal TS of the first MUX unit 5351 is activated or deactivated based on whether the first MUX unit 5351 receives and outputs the serial input data TDI used as the serial test vector or receives and outputs the core internal data C1D1 through C1DN for each port.

Figure 3:
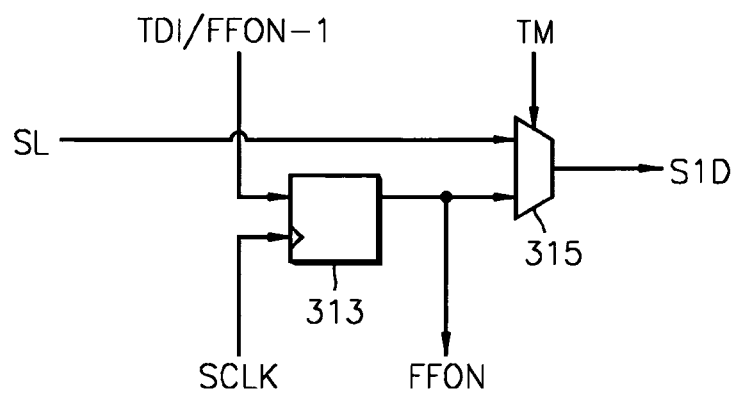
FIG. 3 is a circuit diagram for a scan test circuit for placement near each input terminal of the core block of FIG. 1 where only the core block is designed to be adaptable for the scan test method.
Figure 4:
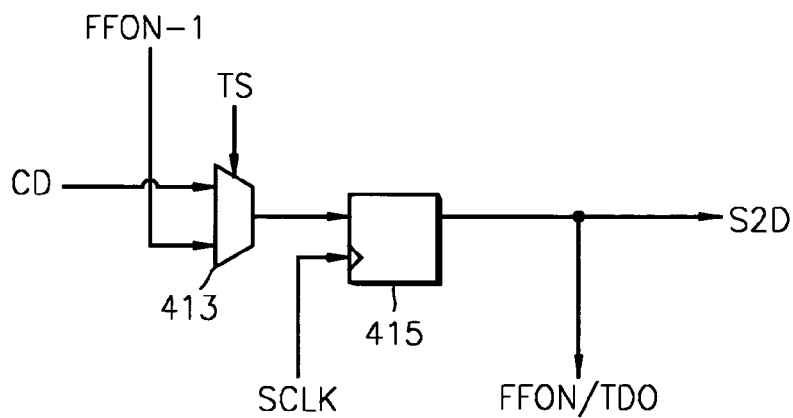
FIG. 4 is a circuit diagram for a scan test circuit for placement near each output terminal of the core block of FIG. 1 where only the core block is designed to be adaptable for the scan test method.

The scan test circuit unit 535 may also have a configuration similar to that described for FIG. 3 or FIG. 4 in various embodiments of the present invention. In such embodiments of the present invention, the scan test circuit unit 535 may include one MUX and one flip-flop for each port. In other words, for a scan test circuit unit 535 having each port configured as shown in FIG. 3, data FFON output from a flip-flop of each port (e.g., a flip-flop 313 of a first port) is input to a flip-flop of a next port. The serial input data TDI used as the serial test vector is input to the flip-flop 313 of the first port. Data FFO1 through FFON output from the flip-flop of each port is input to the first core logic circuit 531, the second core logic circuit unit 539 and/or the second sub logic circuit unit 540 and may be used to determine controllability for the first core logic circuit unit 531, the second core logic circuit unit 539 and/or the second sub logic circuit unit 540. In such embodiments, the control signal TM of a MUX 315 is activated or deactivated based on whether or not a scan test is performed.

For a scan test circuit unit 535 having each port configured as shown in FIG. 4, data FFON output from a flip-flop of each port (e.g., a flip-flop 415 of a first port) is input to a MUX of a next port. Data FFO1 through FFON output from the flip-flop of each port is input to the first core logic circuit unit 531, the second core logic circuit unit 539 and/or the second sub logic circuit unit 540 if the scan test is not performed. In addition, the serial output data TDO output from the flip-flop of the last port may be used to determine observability for normal operations of the first sub logic circuit unit 510, the first core logic circuit unit 531 and/or the second core logic circuit unit 539. A control signal TS of a MUX 413 is activated or deactivated based on whether the MUX 413 receives and outputs to the outside the core internal data C1D1 through C1DN for each port or receives and outputs the data FFO1 through FFON output from its previous port as the serial input data TDI used as the serial test vector.

As described with reference to FIG. 5, the core block 530 is designed (configured) for scan testing and the first and second sub logic units 510 and 540, but not the core block 530, are designed (configured) for dynamic simulation testing. In other embodiments of the present invention, an integrated circuit device including a scan test circuit includes macro blocks that are all configured for dynamic simulation testing. The first sub logic circuit unit 510, the second sub logic circuit unit 540 and the core block 530 may be designed to be adaptable for the dynamic simulation test method. In such embodiments, the core block 530 may not include the scan test circuit unit 535 and may directly generate the core output data C2D1 through C2DN for each port, without using the scan test circuit unit 535, by processing the output data for each port received from the MUX unit 520. For such embodiments, operations of the first sub logic circuit unit 510, the MUX unit 520 and the second sub logic circuit unit 540 are generally similar to those described with reference to FIG. 5 previously.

In some embodiments of the present invention, an integrated circuit device as a whole is not designed to be adaptable for the scan test method. The integrated circuit device can be tested using a method where the core output data C2D1 through C2DN of the core block 530 is input to the core block 530 via the MUX unit 520. Thus, fault coverage may be improved relative to a dynamic simulation test using a functional vector.

As described above, in an integrated circuit device according to some embodiments of the present invention, the first sub logic circuit unit 510, which is designed to be adaptable for the dynamic simulation test method, generates sub data for each port by processing input data MDI received from the outside. The MUX unit 520 is controlled by a MUX control signal and selectively outputs the sub data for each port or outputs core output data for each port. The core block 530 generates core internal data C1D1 through C1DN for each port by processing output data for each port received from the MUX unit 520, outputs the core internal data C1D1-C1DN for each port to the outside using the full scan test method and/or generates the core output data C2D1 through C2DN for each port by selectively processing the core internal data C1D1 through C1DN for each port or the serial input data TDI used as a serial test vector for each port. The second sub logic circuit unit 540, which is designed to be adaptable for the dynamic simulation test method, outputs final output data MDO to outside by processing the core output data C2D1 through C2DN for each port received from the core block 530.

According some embodiments of the present invention, when scan test circuits, whose number is the same as the number of input ports or output ports of a device, are included around a programmable intellectual property (IP) core, only one MUX may be needed for each port near an input terminal of the programmable IP core. Therefore, the scan test circuit may be simplified to allow chip downsizing. As a scan test can be performed using a test vector input to the programmable IP core by a scan test method, fault coverage may be improved. In particular, the present invention may be beneficially used, for example, when the programmable IP core is designed to be adaptable for the scan test method. However, it is also possible to test a device that is not adaptable for the scan test method by re-inputting output data of the programmable IP core to the programmable IP core. This may also improve fault coverage.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device comprising:
a core block configured for dynamic simulation testing and having an associated plurality of output ports, wherein the core block generates core output data for the plurality of output ports;
an input side sub logic circuit unit configured for dynamic simulation testing and coupled to a plurality of input ports of the core block that generates sub data for the plurality of input ports of the core block responsive to data input to the input side sub logic circuit unit; and
a multiplexer (MUX) unit between the core block and the input side sub logic circuit unit that selectively provides the sub data or the core output data as inputs to the input ports of the core block, without synchronizing between the MUX unit and the core block or between the MUX unit and the input side sub logic circuit, responsive to a MUX control signal,
wherein the core block generates the core output data for the plurality of output ports responsive to outputs from the MUX.

2. The integrated circuit device of claim 1 further comprising an output side sub logic circuit unit configured for dynamic simulation testing and coupled to the plurality of output ports of the core block that outputs final output data responsive to the core output data from the core block.

3. The integrated circuit device of claim 2 wherein the MUX unit comprises a plurality of multiplexers, ones of which are associated with respective ones of the input ports of the core block.

4. An integrated circuit device comprising:
a core block having a plurality of output ports and a plurality of input ports and a vector input terminal, wherein the core block generates core internal data and wherein the core block is configured to output the core internal data during scan testing and to selectively generate core output data for the output ports responsive to the core internal data or to test vector serial input data from the vector input terminal;
an input side sub logic circuit unit configured for dynamic simulation testing and coupled to the input ports of the core block that generates sub data for the plurality of input ports responsive to data input to the input side sub logic circuit unit; and a multiplexer (MUX) unit between the core block and the input side sub logic circuit unit that selectively provides the sub data or the core output data as inputs to the input ports of the core block, without synchronizing between the MUX unit and the core block or between the MUX unit and the input side sub logic circuit, responsive to a MUX control signal, wherein the core block generates the core internal data responsive to outputs from the MUX.

5. The integrated circuit device of claim 4 further comprising an output side sub logic circuit unit configured for dynamic simulation testing and coupled to the plurality of output ports of the core block that outputs final output data responsive to the core output data from the core block.

6. The integrated circuit device of claim 5 wherein the core block comprises:
a first core logic circuit unit that generates the core internal data; and
a scan test circuit unit coupled to the first core logic circuit unit and the vector input terminal that is configured to output the core internal data during scan testing and to selectively output data associated with ones of the output ports responsive to the core internal data or to the test vector serial input data.

7. The integrated circuit device of claim 6 wherein the core block further comprises a second core logic unit coupled to the scan test circuit that generates the core output data responsive to the output data associated with ones of the output ports received from the scan test circuit unit.

8. The integrated circuit device of claimed 7 wherein the scan test circuit unit consists of two multiplexers and at least one flip-flop for each output port.

9. The integrated circuit device of claim 8 wherein the scan test circuit unit consists of two multiplexers and one flip-flop for each output port.

10. The integrated circuit device of claim 7 wherein the scan test circuit unit comprises at least one multiplexers and at least one flip-flop for each output port.

11. The integrated circuit device of claim 10 wherein the scan test circuit unit consists of one multiplexers and one flip-flop for each output port.

12. The integrated circuit device of claim 7 wherein the core block has a vector output terminal and wherein the scan test circuit unit is configured to serially output the core internal data to the vector output terminal during scan testing.

13. A method for testing an integrated circuit device in which a plurality of associated macro blocks to be tested are configured for dynamic simulation testing, the method comprising:
generating at a first sub logic circuit unit is of the macro blocks sub data for input to a plurality of input ports of a core block of the macro blocks responsive to data input to the first sub logic circuit unit core from external to the macro blocks;
providing the sub data and/or output data for a plurality of output ports of the core block to a multiplexer (MUX) unit coupled between the core block and the first sub logic circuit that selectively provides the sub data or the output data as inputs to the input ports of the core block, without synchronizing the output data between the output ports of the core block and the MUX unit, responsive to a MUX control signal; and
generating at the core block core output data for the output ports from the MUX input to the input ports of the core block.

14. A method for testing an integrated circuit device in which a core block of a plurality of associated macro blocks to be tested has a vector input terminal and is configured for scan testing and others of the associated macro blocks are configured for dynamic simulation testing, the method comprising:
generating at a first sub logic circuit unit of the others of the associated macro blocks sub data for input to a plurality of input ports of the core block responsive to data input to the first sub logic circuit unit core from external to the macro blocks;
providing the sub data and/or output data for a plurality of output ports of the core block to a multiplexer (MUX) unit coupled between the core block and the first sub logic circuit that selectively provides the sub data or the output data as inputs to the input ports of the core block, without synchronizing the output data between the output ports of the core block and the MUX unit, responsive to a MUX control signal; and
generating at the core block core internal data responsive to the inputs to the input ports of the core block;
outputting from the core block the core internal data during scan testing; and
selectively generating at the core block core output data for the output ports responsive to the core internal data or to test vector serial input data from the vector input terminal.

15. A semiconductor device comprising:
a first sub logic circuit unit which is designed to be adaptable for a dynamic simulation test method and generates sub data for each port by processing data received from the outside;
a MUX unit which is controlled by a MUX control signal and selectively outputs the sub data for each port or core output data for each port;
a core block which is designed to be adaptable for the dynamic simulation test method and generates the core output data for each port by processing the output data for each port received from the MUX unit, wherein the MUX unit selectively outputs the core output data for each port without synchronizing the core output data between output ports of the core block and the MUX unit; and a second sub logic circuit unit which is designed to be adaptable for the dynamic simulation test method and outputs final output data to the outside by processing the core output data for each port received from the core block.

16. A semiconductor device comprising:
a first sub logic circuit unit which is designed to be adaptable for a dynamic simulation test method and generates sub data for each port by processing data received from the outside;
a MUX unit which is controlled by a MUX control signal and selectively outputs the sub data for each port or core output data for each port;
a core block which generates core internal data by processing the output data for each port received from the MUX unit and outputs the core internal data for each port to the outside by using a scan test method or generates the core output data for each port by selectively processing the core internal data for each port or serial input data for each port used as a test vector, wherein the MUX unit selectively outputs the core output data for each port without synchronizing the core output data between output ports of the core block and the MUX unit; and
a second sub logic circuit unit which is designed to be adaptable for the dynamic simulation test method and outputs final output data to the outside by processing the core output data for each port received from the core block.

17. The semiconductor device of claim 16, wherein the core block comprising:
a first core logic circuit unit which generates the core internal data for each port by processing the output data for each port received from the MUX unit;
a scan test circuit unit which outputs the core internal data for each port to the outside by using the scan test method or selectively outputs the core internal data for each port or the serial input data for each port used as the test vector; and
a second core logic circuit unit which generates the core output data for each port by processing the output data for each port received from the scan test circuit unit.

18. The semiconductor device of claim 17 wherein the scan test circuit unit comprises two MUXes and one flip-flop for each port.

19. The semiconductor device of claim 17 wherein the scan test circuit unit comprises one MUX and one flip-flop for each port.

20. A test method of a semiconductor device in which all macro blocks are designed to be adaptable for a dynamic simulation test method, the test method comprising:
generating sub data for each port by processing data received from the outside, at a first sub block included in the macro blocks;
selectively outputting the sub data for each port or core output data for each port, at a MUX included in the macro blocks and controlled by a MUX control signal, without synchronizing the core output data for each port between output ports of a core block included in the macro blocks and the MUX;
generating the core output data for each port by processing the output data for each port received from the MUX, at the core block included in the macro blocks; and
outputting final output data to the outside by processing the core output data for each port received from the core block, at a second sub block included in the macro blocks.

21. A test method of a semiconductor device in which a core block of macro blocks is designed to be adaptable for a scan test method and other blocks of the macro blocks are designed to be adaptable for a dynamic simulation test method, the test method comprising:
generating sub data for each port by processing data received from outside, at a first sub block included in the other blocks of the macro blocks;
selectively outputting the sub data for each port or core output data for each port, at a MUX included in the other blocks of the macro blocks and controlled by a MUX control signal, without synchronizing the core output data for each port between output ports of the core block and the MUX;
generating core internal data for each port by processing the output data for each port received from the MUX or generating the core output data for each port by selectively processing the core internal data for each port or serial input data used as a test vector received from outside, at the core block included in the macro blocks; and
outputting final output data to the outside by processing the core output data for each port received from the core block, at a second sub block included in the other blocks of the macro blocks.

22. The test method of claim 21 wherein the core internal data for each port can be outputted to the outside by a scan test circuit using the scan test method.

23. The test method of claim 22 wherein the scan test circuit comprises two MUXes and one flip-flop for each port.

24. The test method of claim 23 wherein the scan test circuit comprises one MUX and one flip-flop for each port.

* * * * *

UNITED STATES PATENT AND TRADEMARK OFFICE
CERTIFICATE OF CORRECTION

PATENT NO. : 7,249,300 B2          Page 1 of 1
APPLICATION NO. : 10/696090
DATED : July 24, 2007
INVENTOR(S) : Chung et al.

It is certified that error appears in the above-identified patent and that said Letters Patent is hereby corrected as shown below:

Column 11, Claim 8, Line 53:    Please correct "claimed 7"
                                               To read -- claim 7 --

Column 11, Claim 8, Line 54:    Please correct "consists of two"
                                               To read -- comprises a plurality of --

Column 11, Claim 10, Line 61:    Please correct "multiplexers"
                                               To read -- multiplexer --

Column 11, Claim 11, Line 64:    Please correct "multiplexers"
                                               To read -- multiplexer --

Column 12, Claim 13, Line 8:    Please correct "circuit unit is of"
                                               To read -- circuit unit of --

Signed and Sealed this

Tenth Day of June, 2008

JON W. DUDAS
*Director of the United States Patent and Trademark Office*